(12) United States Patent
Edwards et al.

(10) Patent No.: US 7,268,428 B2
(45) Date of Patent: Sep. 11, 2007

(54) THERMAL PASTE CONTAINMENT FOR SEMICONDUCTOR MODULES

(75) Inventors: David L. Edwards, Poughkeepsie, NY (US); Sushumna Iruvanti, Wappingers Falls, NY (US); Hilton T. Toy, Hopewell Junction, NY (US); Wei Zou, Wappingers Falls, NY (US)

(73) Assignee: International Business Machines Corporation, Armonk, NY (US)

( * ) Notice: Subject to any disclaimer, the term of this patent is extended or adjusted under 35 U.S.C. 154(b) by 125 days.

(21) Appl. No.: 11/160,997

(22) Filed: Jul. 19, 2005

(65) Prior Publication Data

US 2007/0045819 A1 Mar. 1, 2007

(51) Int. Cl.
*H01L 23/34* (2006.01)

(52) U.S. Cl. ...................... 257/712; 257/717
(58) Field of Classification Search ............... 257/712, 257/717, 719, 707
See application file for complete search history.

(56) References Cited

U.S. PATENT DOCUMENTS

| | | |
|---|---|---|
| 5,106,784 A | 4/1992 | Bednarz |
| 5,227,663 A | 7/1993 | Patil et al. |
| 5,455,456 A | 10/1995 | Newman |
| 5,706,171 A | 1/1998 | Edwards et al. |
| 5,891,755 A | 4/1999 | Edwards et al. |
| 5,909,056 A | 6/1999 | Mertol |
| 5,950,074 A | 9/1999 | Glenn et al. |
| 6,117,705 A | 9/2000 | Glenn et al. |
| 6,218,730 B1 | 4/2001 | Toy et al. |
| 6,268,654 B1 | 7/2001 | Glenn et al. |
| 6,794,749 B2 | 9/2004 | Akram |
| 2007/0045819 A1* | 3/2007 | Edwards et al. ............ 257/704 |

* cited by examiner

*Primary Examiner*—Mark V. Prenty
(74) *Attorney, Agent, or Firm*—Gibb & Rahman, LLC; Joseph Petrokaitis, Esq.

(57) ABSTRACT

A semiconductor module structure and a method of forming the semiconductor module structure are disclosed. The structure incorporates a die mounted on a substrate and covered by a lid. A thermal compound is disposed within a thermal gap between the die and the lid. A barrier around the periphery of the die extends between the lid and the substrate, contains the thermal compound, and flexes in response to expansion and contraction of both the substrate and the lid during cycling of the semiconductor module. More particularly, either the barrier is formed of a flexible material or has a flexible connection to the substrate and/or to the lid. The barrier effectively contains the thermal compound between the die and the lid and, thereby, provides acceptable and controlled coverage of the thermal compound over the die for heat removal.

6 Claims, 13 Drawing Sheets

(See Figures 25-27)

THERMAL PASTE CONTAINMENT FOR SEMICONDUCTOR MODULES

BACKGROUND OF THE INVENTION

1. Field of the Invention

The invention generally relates to a semiconductor module structure and method of forming the semiconductor module structure and, more particularly, to a thermal paste containment system incorporated into a semiconductor module structure and a method for forming the thermal paste containment system within the semiconductor module.

2. Description of the Related Art

Many structures are known for removing or dissipating heat from semiconductor dies. In one structure a die is mounted on a substrate and a flat cooling plate or flat lid is placed over a die. The gap between the die and the lid are filled in with a thermal compound (i.e., thermal grease, thermal paste, thermal gel, etc.), which promotes heat conduction between the lid and the die. Controlling the coverage of the thermal paste over the die to ensure that the gap is filled in is critical for heat removal. Thermal cycling of the semiconductor module can result in the expansion and contraction of the lid and substrate. This expansion and contraction can result in pumping of the thermal compound such that the thermal compound moves out of the interface between the die and the lid, leaving air pockets and reducing effective heat removal. This disclosure presents a method and structure for containing the thermal compound between the die and lid to limit the effects of thermal compound pumping.

SUMMARY OF THE INVENTION

This disclosure presents a semiconductor module with a thermal compound containment system and a method of forming the semiconductor module. Embodiments of the semiconductor module comprise a die mounted on a substrate and covered by a lid. A thermal compound is disposed between the die and the lid such that it covers the die and fills in any gaps between the die and the lid. A barrier is positioned adjacent to the periphery of the die and extends vertically between the substrate and the lid in order to contain the thermal compound. The lid is planar and extends horizontally over the die and beyond the barrier. The lid can further comprise an outer rim that projects towards the substrate and is sealed thereto (e.g., by a thermosetting sealant). The barrier is particularly configured to flex in response to expansion and contraction of the substrate and the lid in response to thermal cycling. Specifically, the barrier can either comprise a fully flexible material or a flexible connection between the body of the barrier and the substrate (i.e., first connection) and/or the lid (i.e., second connection). In either structural embodiment the barrier can comprise one or more openings that allow excess thermal compound to escape the thermal gap between the die and lid during the manufacturing process.

More particularly, in one embodiment of the structure of the invention, the barrier can comprise a flexible polymer material, such as a cured b-stage epoxy resin. This flexible barrier can adhere directly to both the substrate and the lid in order to form the first connection and the second connection. Alternatively, this flexible barrier can adhere directly only to the substrate. If the barrier adheres directly only to the substrate, then the lid can comprise a plurality of extensions to connect the lid to the barrier. For example, the plurality of extensions can project away from the lid towards the substrate and can align over the barrier. The extensions can be adapted to penetrate and to remain fixed to the barrier when the lid covers the die.

In another embodiment of the structure of the invention, the body of the barrier can comprise a rigid material (e.g., a metal or a plastic material). In order to ensure that the barrier is adapted to flex in response to expansion and contraction of the substrate and the lid, the first connection and/or the second connection comprises a flexible connection (e.g., a connection formed of a cured material such as an elastomer or a b-stage epoxy resin). For example, a groove can be formed in the bottom surface of the lid and can be adapted for receiving the barrier. When the lid covers the die, a flexible connection between the body of the barrier and the groove can be formed with a cured elastomer or a cured b-stage epoxy resin that adheres the barrier within the groove. In another example, the body of the barrier can comprise rigid material fixedly attached or integral to the lid (e.g., a metal barrier machined into the lid). When the lid covers the die, a flexible connection between the body of the barrier and the substrate can be formed with a cured material, such as an elastomer or a b-stage epoxy resin. In yet another example, the body of the barrier can be formed by attaching a rigid material (e.g., metal or plastic) onto the substrate using a cured material, such as an elastomer or a cured b-stage epoxy resin, to form a flexible connection. The lid can comprise a plurality of extensions that project away from the lid and aligned above the barrier. The plurality of extensions can be adapted to penetrate and remain fixed to the rigid material forming the barrier, as the lid covers the die.

Embodiments of the method of forming a semiconductor module having a thermal compound containment system comprise forming a barrier that is particularly adapted to flex in response to expansion and contraction of the substrate and the lid, either because the barrier is formed of a flexible material or because the barrier comprises a flexible connection to the substrate (i.e., first connection) and/or the lid (i.e., second connection). In one embodiment of the method the barrier is formed of a flexible material. This method comprises mounting a die on a top surface of a substrate. A lid is formed that is configured to cover the die and to extend beyond the periphery of the die. The lid can further be formed with an outer rim that extends towards the substrate and is sealed thereto. A flexible barrier is formed such that when the lid covers the die, the barrier is positioned adjacent the periphery of the die and extends vertically between the substrate and the lid to create a thermal gap. The flexible barrier comprises a material adapted to flex in response to expansion and contraction of the substrate and the lid. A thermal compound is disposed within the thermal gap between the lid and the die. The process of disposing the thermal compound within the thermal gap can comprise before covering the die with the lid, depositing the thermal compound on the die and/or the lid such that when the lid covers the die the thermal compound is disposed within the thermal gap. The flexible barrier is configured to prevent the thermal compound from flowing outside the thermal gap. Forming the flexible barrier comprises patterning the flexible barrier with at least one opening to allow air and/or excess thermal compound to escape the thermal gap during the process of forming the semiconductor module. Forming the flexible barrier can comprise depositing a curable material (i.e., a curable polymer such as an elastomer or a b-stage epoxy resin) on the lid and/or the substrate such that when the lid covers the die, the curable material extends between the substrate and the lid. The material is cured in order to form the flexible barrier and to adhere the flexible barrier to the lid and the substrate. Alternatively, the flexible barrier can be formed by depositing a curable material (i.e., a curable polymer such as an elastomer or an epoxy resin) on the substrate such that when the lid covers the die, the barrier extends from the substrate towards the lid. The material is cured to form the flexible barrier and to adhere the flexible barrier to the substrate. The flexible barrier can be connected and sealed to the bottom surface of the lid (i.e., surface covering the die) by a plurality of extensions that, when the lid covers the die, project from the bottom surface of the lid towards the substrate and are aligned above the flexible barrier. The plurality of extensions provides a contact area for connecting the barrier to the lid in order to form a complete barrier structure. The extensions can further be configured to penetrate the flexible barrier and to remain fixed to the flexible barrier when the lid covers the die.

In another embodiment of the method, the flexible barrier is formed by forming a body of the barrier with a flexible connection to the substrate (i.e., first connection) and/or the lid (i.e., second connection). The method comprises mounting a die on a top surface of a substrate. A lid is formed that is configured to cover the die and to extend beyond the periphery of the die. The lid can also be formed with an outer rim that projects toward the substrate and is sealed thereto. The body of the barrier is formed with a rigid material (e.g., metal or plastic) that is configured to be positioned adjacent the periphery of the die and to extend vertically between the substrate and the lid when the lid covers the die, thus, creating a thermal gap. The body of the barrier is flexibly connected to the lid and/or the substrate. The flexible connection is adapted to allow the thermal gap to flex in response to expansion and contraction of the substrate and the lid. A thermal compound is disposed within the thermal gap between the lid and the die. Again, the process of disposing the thermal compound within the thermal gap can comprise before covering the die with the lid, depositing the thermal compound on the die and/or the lid such that when the lid covers the die the thermal compound is disposed within the thermal gap. The barrier is configured to prevent the thermal compound from flowing outside the thermal gap. As with the previously described embodiment, forming the barrier can comprise patterning the barrier with at least one opening to allow air and excess thermal compound to escape the thermal gap during the process of forming the semiconductor module. The flexible connection may be between the body of the barrier and the lid. For example, the body of the barrier can be formed by positioning a rigid material (e.g., a metal or plastic) on the substrate. The connection between the body of the barrier and the substrate may or may not be flexible. The lid is formed with a groove, adapted for receiving a top of the body of the barrier. A curable material (i.e., a curable polymer such as an elastomer or an epoxy resin) can be deposited onto the body of the barrier and/or in the groove of the lid. When the lid covers the die, the top of the body of the barrier is received by the groove. The material is cured such that the body of the barrier is adhered to the groove in the lid and a flexible connection is created. Alternatively, the flexible connection may be between the body of the barrier and the substrate with the connection between the body of the barrier and the lid optionally flexible. For example, the body of the barrier may be integrally formed with the lid, such as a metal body of the barrier machined into a metal lid. A curable material (i.e., a curable polymer), deposited on the bottom of the body of the barrier or on the substrate adjacent to the periphery of the die, is used to flexibly connect the body of the barrier to the substrate when the lid covers the die. In another example, the body of the barrier may be formed on the lid by attaching the rigid material to the lid with an adhesive, connector, etc. In this example, a curable material that is deposited on the bottom of the body of the barrier or on the substrate adjacent to the periphery of the die would also be used to flexibly connect the body of the barrier to the lid when the lid covers the die. In another example, the body of the barrier may be formed on the substrate by attaching the rigid material to the substrate with a curable material (i.e., a curable polymer) to form the flexible connection. The lid in this example is formed with a plurality of extensions configured to project from the lid towards the substrate and to align over the body of the barrier, when the lid covers the die. The extensions provide a contact area for connecting the body of the barrier to the lid in order to form a complete barrier structure. The extensions can further be configured to penetrate the barrier and to remain fixed thereto.

These, and other, aspects and objects of the present invention will be better appreciated and understood when considered in conjunction with the following description and the accompanying drawings. It should be understood, however, that the following description, while indicating preferred embodiments of the present invention and numerous specific details thereof, is given by way of illustration and not of limitation. Many changes and modifications may be made within the scope of the present invention without departing from the spirit thereof, and the invention includes all such modifications.

BRIEF DESCRIPTION OF THE DRAWINGS

The invention will be better understood from the following detailed description with reference to the drawings, in which.

DETAILED DESCRIPTION OF PREFERRED EMBODIMENTS OF THE INVENTION

Figure 1:
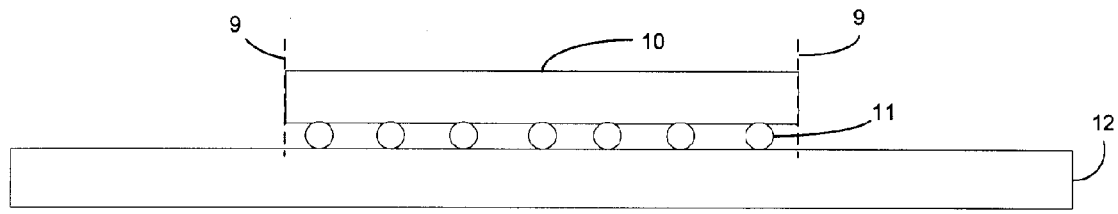
FIG. 1 is a schematic illustration of a partially completed semiconductor module of the present invention.

The present invention and the various features and advantageous details thereof are explained more fully with reference to the non-limiting embodiments that are illustrated in the accompanying drawings and detailed in the following description. It should be noted that the features illustrated in the drawings are not necessarily drawn to scale. Descriptions of well-known components and processing techniques are omitted so as to not unnecessarily obscure the present invention. The examples used herein are intended merely to facilitate an understanding of ways in which the invention may be practiced and to further enable those of skill in the art to practice the invention. Accordingly, the examples should not be construed as limiting the scope of the invention.

As stated above, controlling the coverage of a thermal compound (i.e., thermal paste, gel, grease, etc.) over the die to ensure that gaps are filled in between the die and lid throughout the life of the application is critical for heat removal. Temperature cycling of the semiconductor module can result in the expansion and contraction of the lid and substrate. This expansion and contraction can result in changes in the gap between the die and the lid causing pumping of the thermal compound such that the thermal compound moves away from the interface between the die and the lid. U.S. Pat. No. 5,706,171 to Edwards et al. issued on Jan. 6, 1998; U.S. Pat. No. 5,891,755 issued to Edwards et al. on Apr. 6, 1999; and, U.S. Pat. No. 6,794,749 issued to Akram on Sep. 21, 2004, each of which are incorporated herein by reference, disclose semiconductor chip package structures incorporating thermal compounds to dissipate heat as well as a means for containing the thermal compounds. The disclosed structures are rigid to prevent any movement of the thermal paste. However, manufacturing such structures may be costly and inefficient. This disclosure presents an alternative structure for containing a thermal compound between the die and lid of a semiconductor module in order to limit the effects of thermal compound pumping and a method for manufacturing the structure.

More particularly, this disclosure presents a semiconductor module that has a thermal compound containment system and a method of forming the semiconductor module. Referring to FIG. 1, embodiments of the semiconductor module of the present invention each comprise a die 10, having an outer periphery 9. The die 10 is mounted (e.g., by solder joints 11) on a substrate 12. Referring to the exemplary completed semiconductor module structures (500, 700, 1100, 1400, 1700 and 2100) of FIGS. 5, 7, 11, 14, 17, and 21, respectively, each structural embodiment further comprises a lid (513, 713, 1113, 1413, 1713 and 2113) which covers the die 10. A thermal compound (515, 715, 1115, 1415, 1715 and 2115) is disposed between the die 10 and the lid (513, 713, 1113, 1413, 1713 and 2113) such that it covers the die 10 and fills in the thermal gap between the die 10 and the lid (513, 713, 1113, 1413, 1713 and 2113). A barrier(514, 714, 1114, 1414, 1714 and 2114) is positioned adjacent the periphery 9 of the die 10, and thereby, around the thermal compound (515, 715, 1115, 1415, 1715 and 2115). The barrier (514, 714, 1114, 1414, 1714 and 2114) extends vertically between the substrate 12 and the lid (513, 713, 1113, 1413, 1713 and 2113) defining the thermal gap (516, 716, 1116, 1416, 1716 and 2116). The lid (513, 713, 1113, 1413, 1713 and 2113) is planar and extends horizontally over the thermal compound (515, 715, 1115, 1415, 1715 and 2115) and beyond the barrier (514, 714, 1114, 1414, 1714 and 2114). The lid (513, 713, 1113, 1413, 1713 and 2113) can further comprise an outer rim (517, 717, 1117, 1417, 1817 and 2117) that projects towards the substrate 12 and is sealed thereto (e.g., by a flexible sealant (518, 718, 1118, 1418, 1718 and 2118). The barrier (514, 714, 1114, 1414, 1714 and 2114) also comprises a first connection (521, 721, 1121, 1421, 1721 and 2121),that connects the barrier (514, 714, 1114, 1414, 1714 and 2114) to the substrate 12 and a second connection (522, 722, 1122, 1422, 1722 and 2122) that connects the barrier (514, 714, 1114, 1414, 1714 and 2114) to the lid (513, 713, 1113, 1413, 1713 and 2113). The barrier (514, 714, 1114, 1414, 1714 and 2114) is adapted to contain the thermal compound (515, 715, 1115, 1415, 1715 and 2115) that is located within the thermal gap (516, 716, 1116, 1416, 1716 and 2116). The barrier (514, 714, 1114, 1414, 1714 and 2114) is also particularly configured such that it flexes in response to expansion and contraction of the substrate 12 and the lid (513, 713, 1113, 1413, 1713 and 2113) during thermal cycling of the semiconductor module, Specifically, in one structural embodiment the barrier flexes because it comprises a flexible material (e.g., barriers 514 and 714 of FIGS. 5 and 7, respectively). In another structural embodiment the barrier flexes because of a flexible connection between the body of the barrier and the substrate (i.e., a first connection) and/or between the body of the barrier and the lid (i.e., a second connection). For example, see barriers 1114, 1414, 1714 and 2114 of FIGS. 11, 14, 17 and 21, respectively.

Figure 4:
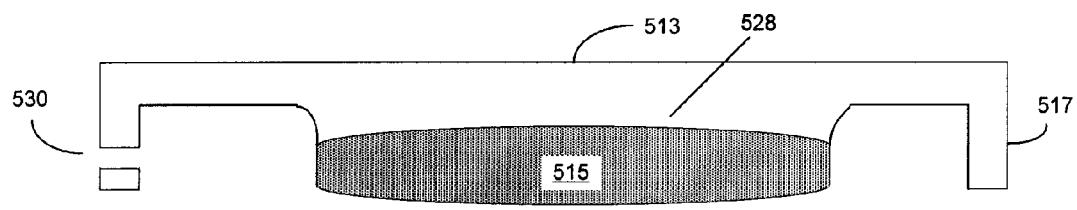
FIG. 4 is a schematic illustration of a partially completed semiconductor module of the present invention.
Figure 5:
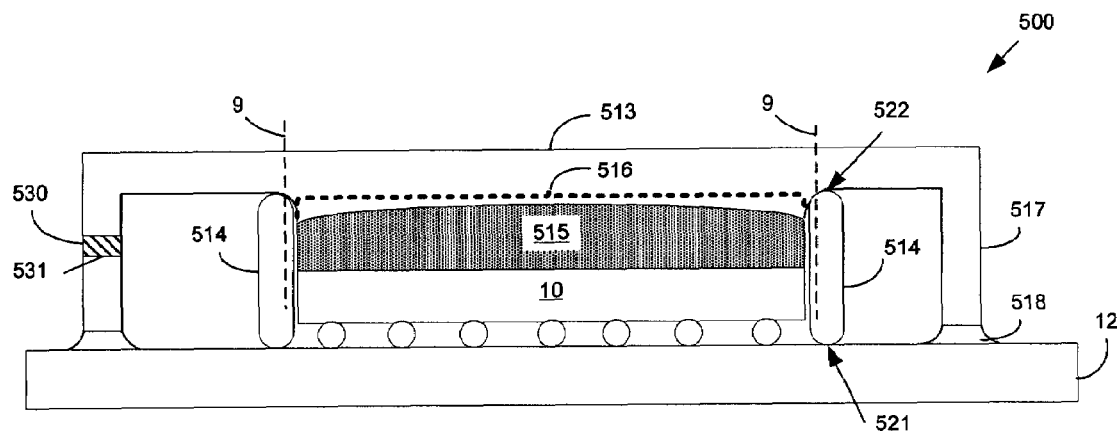
FIG. 5 is a schematic illustration of a completed semiconductor module of the present invention.
Figure 7:
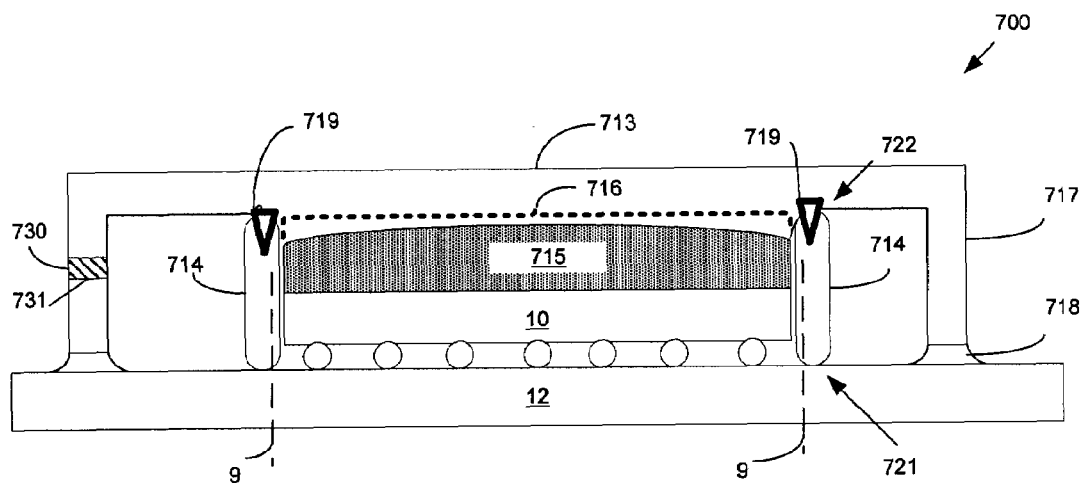
FIG. 7 is a schematic illustration of a completed semiconductor module of the present invention.

FIGS. 5 and 7 are exemplary illustrations of structures 500 and 700 in which the barrier 514, 714 comprises a flexible material (e.g., a cured material such as a thermosetting elastomer or b-stage epoxy resin). Referring to FIG. 5, in one embodiment the flexible barrier 514 can adhere directly to both the substrate 12 and the lid 513 in order to form the first connection 521 and the second connection 522, respectively. Note that the lid 513 (in this structural embodiment and in any of the other structural embodiments discussed below) may be formed with a pedestal 528 (see FIG. 2) configured to be positioned on the thermal compound 515 (e.g., see the thermal compound 515 deposited on the pedestal 528 of FIG. 4). Alternatively, referring to FIG. 7, a flexible barrier 714 (e.g, a cured material such as a thermosetting elastomer or b-stage epoxy resin) can adhere directly to the substrate 12 and be otherwise connected to the lid 713. For example, the lid 713 can comprise a plurality of extensions 719 that provide a barrier contact area for connecting the lid 713 to the barrier 714 in order to form a complete barrier structure (i.e., second connection 722). The extensions 719 can project away from the lid 713 towards the substrate 12 and can be aligned over the barrier 714, which the lid 713 covers the die 10. The extensions 719 can be adapted to penetrate and to remain fixed to the barrier 714. The extensions 719 can comprise blades with various features.

Figure 14:
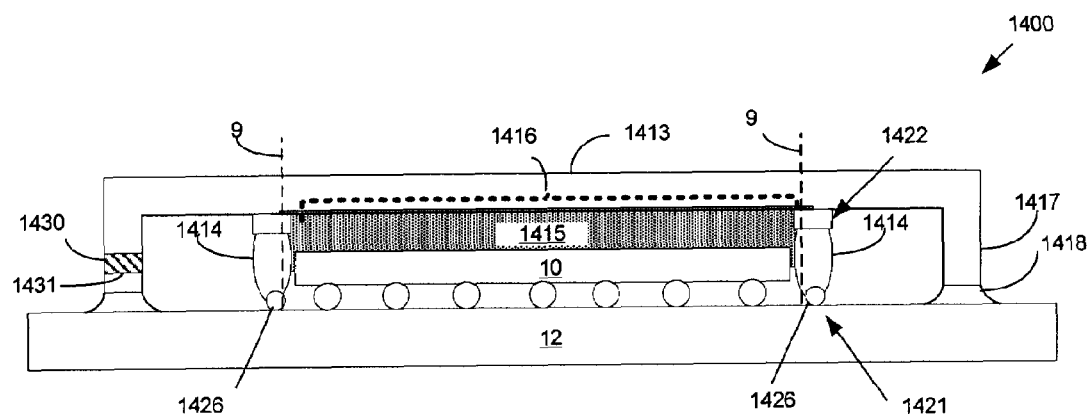
FIG. 14 is a schematic illustration of a completed semiconductor module of the present invention.

FIGS. 11, 14, 17, and 21 are exemplary illustrations of structures (1100, 1400, 1700 and 2100) in which the barrier comprises a flexible connection to the substrate (i.e., first connection (1121, 1421, 1721 and 2121)) and/or a flexible connection to the lid (i.e., second connection (1122, 1422, 1722 and 2122)). The barrier (1114, 1414, 1714 and 2114) of these embodiments can comprise a rigid material (e.g., a metal or a plastic material). In order to ensure that the barrier (1114, 1414, 1714 and 2114) is adapted to flex in response to expansion and contraction of the substrate 12 and the lid (1113, 1413, 1713 and 2113), the first connection (e.g., 1421, 1721, 2121 and possibly 1121 of FIGS. 14, 17, 21 and 11, respectively) or the second connection (e.g., 1122 and possibly 1422 of FIGS. 11 and 14, respectively) comprise a flexible connection (e.g., a connection formed of a curable material (i.e., a curable polymer) 1126, 1426, 1726, and 2126, such as an elastomer or b-stage epoxy resin). For example, referring to structure 1100 of FIG. 11, a groove 1125 can be formed in the lid 1113 and can be adapted for receiving the barrier 1114 when the lid 1113 covers the die 10. The barrier 1114 is formed on the substrate 12. The first connection 1121 may be flexible (e.g., by using a thermosetting elastomer or b-stage epoxy resin) or the first connection 1121 may be rigid. A flexible second connection 1122 between the body of the barrier 1114 and the groove 1125 can be formed with a curable material (i.e., a curable polymer) 1126 deposited into the groove 1125 and/or onto the barrier 1114. Once the lid 1113 covers the die 10 and the thermal compound 1115 is disposed between the lid 1113 and the die 10, the curable material 1126 is cured in order to flexibly adhere the barrier 1114 within the groove 1125. Alternatively, referring to structures 1400 of FIG. 14 and 1700 of FIG. 17, the barrier 1414, 1714 can comprise a rigid material (e.g., metal or plastic) formed on the lid 1413, 1713 and may be connected (either flexibly or rigidly) to the lid, as illustrated in FIG. 14. The barrier may also be formed integral with the lid, as illustrated by the metal barrier 1714 machined into the lid 1713. When the lid 1413, 1713 covers the die 10, a flexible first connection 1421, 1721 can be formed with a curable material 1426, 1726 (e.g., a thermosetting elastomer or an epoxy resin) and curing the curable material. Alternatively, referring to structure 2100 of FIG. 21, the barrier 2114 (e.g., metal or plastic) can be formed on the substrate 12 with a flexible first connection 2121 by connecting the body of the barrier 2114 to the substrate 12 with a curable material 2126. The lid 2113 can comprise a plurality of extensions 2119 that project away from the lid 2113 towards the substrate 12 and can be aligned above the barrier 2114 to provide a barrier contact area for connecting the lid 2113 to the barrier 2114. The plurality of extensions 2119 can be adapted to penetrate and remain fixed to the rigid barrier 2114 when the lid 2113 covers the die 10. The extensions 2119 can comprise blades with various features.

Figure 22:
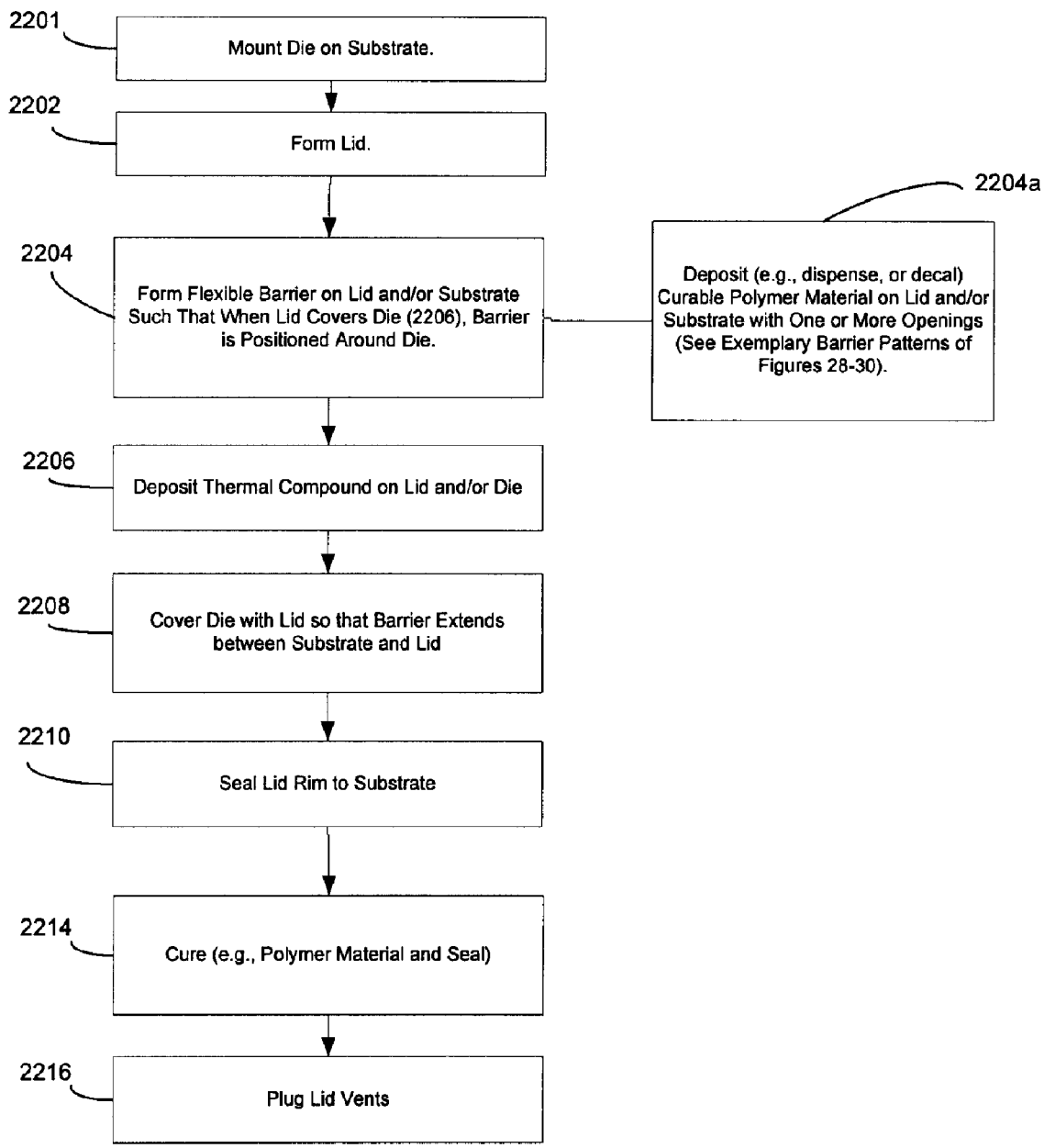
FIG. 22 is a schematic flow diagram illustrating an embodiment of the method of the invention.
Figure 23:
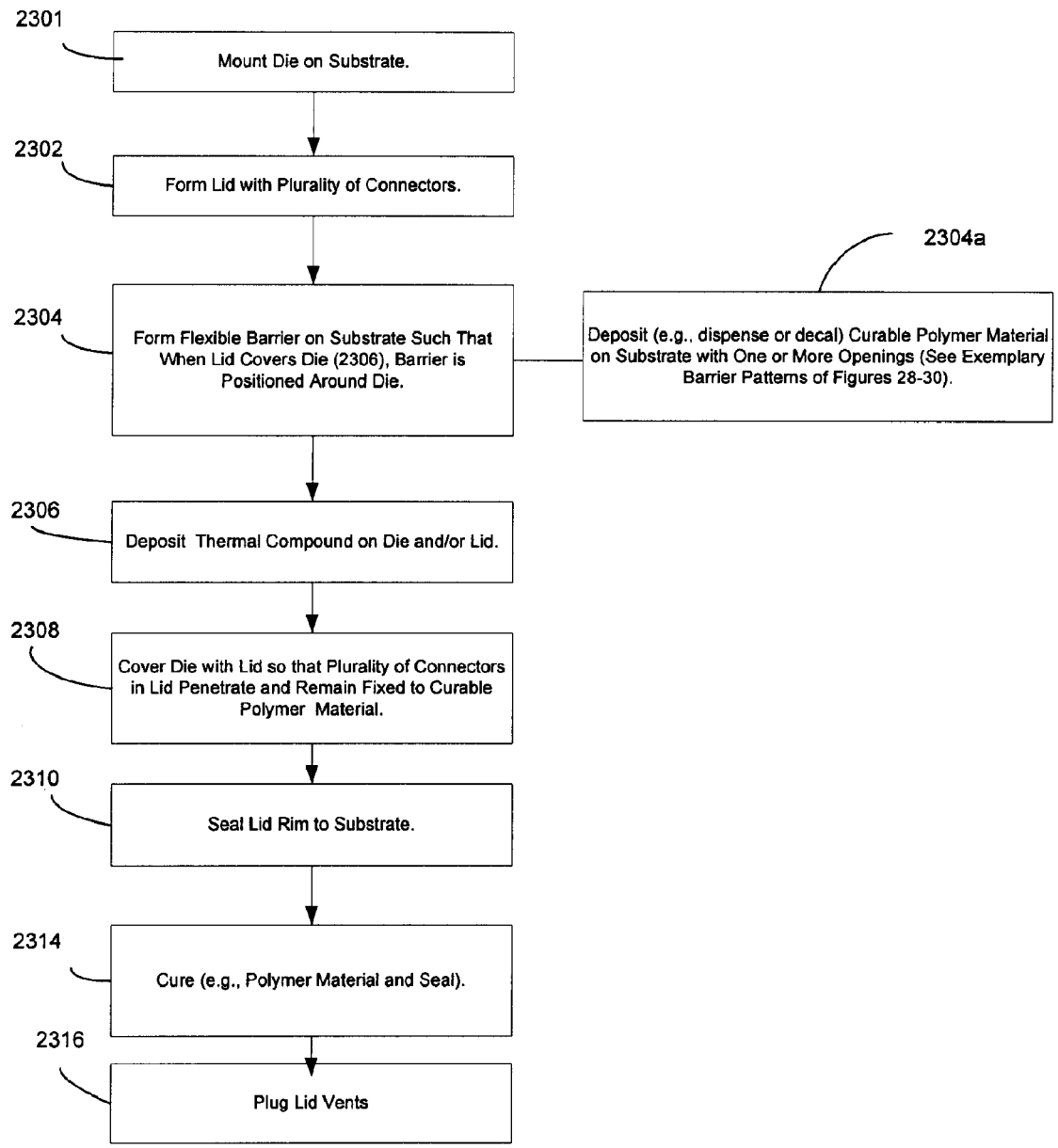
FIG. 23 is a schematic flow diagram illustrating another embodiment of the method of the invention.
Figure 25:
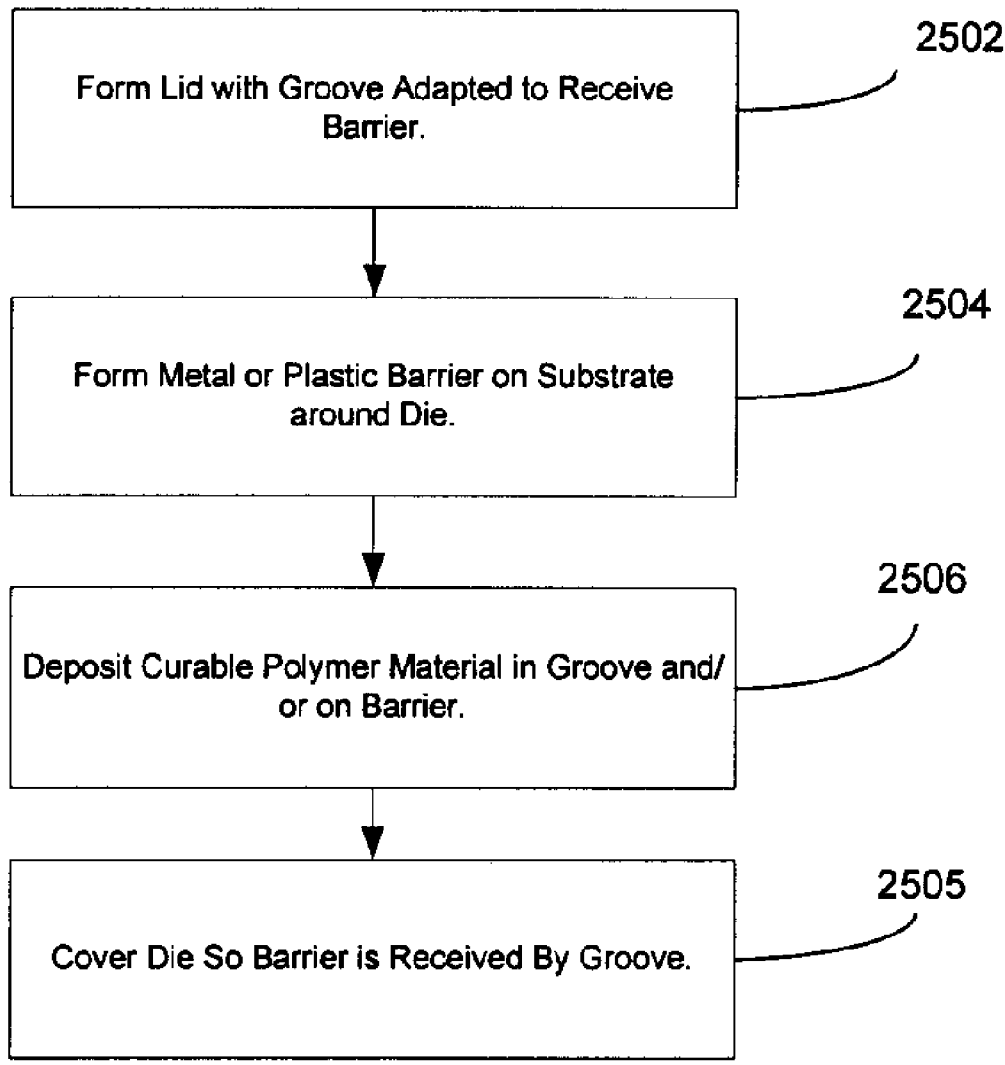
FIGS. 25-27 are schematic flow diagrams illustrating exemplary steps for completing method processes 2404, 2405 and 2406 of the embodiment of the method illustrated in FIG. 24.

Embodiments of the method of forming a semiconductor module having a thermal compound containment system comprise forming a barrier that is particularly adapted to flex in response to expansion and contraction of the substrate and the lid, either because the barrier is formed of a flexible material or because the barrier comprises a flexible connection to the substrate (i.e., first connection) and/or the lid (i.e., second connection). The flow diagrams of FIGS. 22 and 23 illustrate embodiments of the method of forming structures of the present invention that incorporate a barrier comprising a flexible material, as illustrated in exemplary structures 500 and 700 of FIGS. 5 and 7. The flow diagram of FIG. 25 illustrates an embodiment of the method of forming structures of the present invention that incorporate a barrier with a body having a flexible connection to the substrate and/or the lid, as illustrated in structure 1100, 1400, 1700, and 2100 of FIGS. 11, 14, 17, and 21. All of these methods comprise mounting a die 10, having a periphery 9, on a top surface of a substrate 12, as illustrated in FIG. 1 (2201, 2301, and 2401). A lid is formed that is configured to cover the die 10 and to extend beyond the periphery 9 of the die 10 (2202, 2302, and 2402).

Figure 2:
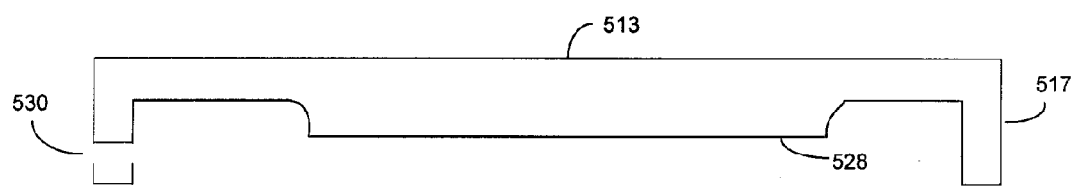
FIG. 2 is a schematic illustration of a partially completed semiconductor module of the present invention.
Figure 3:
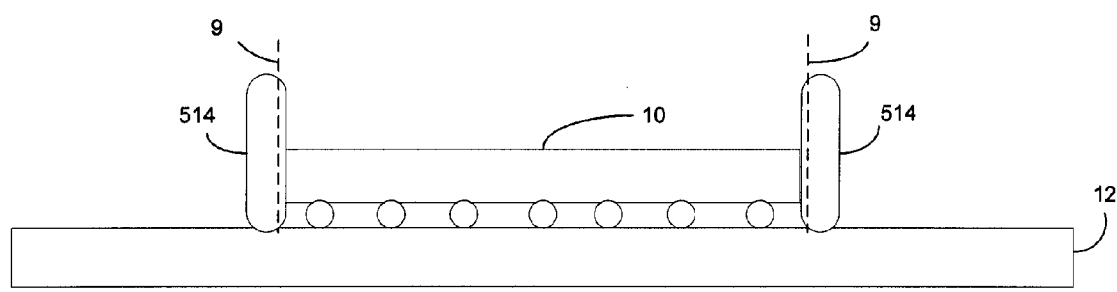
FIG. 3 is a schematic illustration of a partially completed semiconductor module of the present invention.

Referring to the flow diagram of FIG. 22 and the structure 500 of FIG. 5, the die 10 is mounted on the substrate 12 (2201, see FIG. 1) and the lid 513 is formed (2202, see FIG. 2). The lid can be formed with a pedestal 528, although not required, in an area corresponding to the die 10 for positioning adjacent the thermal compound 515. The lid 513 can further be formed with an outer rim 517 that extends towards the substrate 12 and is sealed thereto by sealant 518 at process 2210. A flexible barrier 514 can be formed on the lid 513 and/or the substrate 12 such that when the lid covers the die (at process 2208), the flexible barrier 514 is positioned adjacent the periphery 9 of the die 10 and extends vertically between the substrate 12 and the lid 513 to create a thermal gap 516 (2204, see FIG. 3). The flexible barrier 514 comprises a material adapted to flex in response to expansion and contraction of the substrate 12 and the lid 513. During the process of forming the flexible barrier (2204), the barrier 514 can be patterned (see discussion regarding FIGS. 28-30 below) with at least one opening to allow air and/or excess thermal compound 515 to escape the thermal gap 516 during the process of forming the semiconductor module. The flexible barrier 514 can be formed by depositing a curable material (e.g., a polymer such as a b-stage epoxy resin which can be dispensed or applied as a b-stage decal) onto the substrate 12 or the lid 513. A thermal compound 515 is deposited on the die and/or the lid such that when the lid covers the die (at process 2208) the thermal compound is disposed within the thermal gap (as illustrated in FIG. 4) (2206). The lid 513 is placed over the die 10 so that the barrier 514 extends between the substrate 12 and the lid 513 to form the thermal gap 516 (2206). An outer rim 517 of the lid 513 can be sealed to the substrate 12 by sealant 518 (2210). The flexible barrier 514 is configured to prevent the thermal compound 515 from flowing outside the thermal gap 516. The curable materials (e.g., barrier 514 and sealant 518) should be cured (2214) (e.g., in an approximately 125-150 degree Celcius range for approximately 1-2 hours). Curing the barrier 514 simultaneously sets the flexible barrier and adheres the flexible barrier to the lid 514 and the substrate 12. Lastly, vents in the lid 513 that allow air to escape during the encapping process should be plugged (e.g., vent 530 plugged with plug 531) (2216). For example, to form the plug 531 an elastomer mechanical pin made of a fluorocarbon material may be inserted into the vent 530 followed applying a non-thermal sealant such as a UV adhesive.

Figure 6:
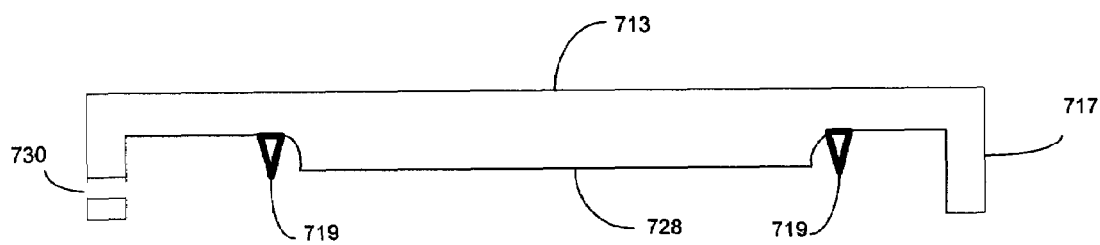
FIG. 6 is a schematic illustration of a partially completed semiconductor module of the present invention.

Alternatively, referring to the flow diagram of FIG. 23 and the structure 700 of FIG. 7, the die 10 is mounted on the substrate 12 (2301, see FIG. 1) and the lid 713 is formed (2302, see FIG. 6). The lid 713 can be formed with a pedestal 728, although not required, in an area corresponding to the die 10 for positioning adjacent the thermal compound 715 (see FIG. 6). More, particularly, the lid 713 of FIG. 7 is formed with a plurality of extensions 719 (see FIG. 6) such that the extensions 719 project from the bottom surface of the lid 713, are aligned above the flexible barrier 714 when the lid 714 covers the die 10 (at process 2306). Theses extensions 719 provide a barrier contact area for connecting the lid 713 to the barrier 714 in order to form a complete barrier structure. The plurality of extensions 719 can be configured to penetrate the flexible barrier 714 and to remain fixed to the flexible barrier 714 upon covering the die 10 with the lid 714. The extensions 719 can comprise blades with various features. A flexible barrier 714 can be formed on the substrate 12 such that when the lid 713 covers the die (at process 2308), the flexible barrier 714 is positioned adjacent the periphery 9 of the die 10 and extends vertically between the substrate 12 and the lid 713 to create a thermal gap 716 (2304). The flexible barrier 714 comprises a material adapted to flex in response to expansion and contraction of the substrate 12 and the lid 713. The flexible barrier 714 can be formed by depositing a curable material (e.g., a polymer such as a b-stage epoxy resin which can be dispensed or applied as a b-stage decal) onto the substrate. As the flexible barrier 714 is deposited, it can be patterned (see discussion regarding FIGS. 28-30 below) with at least one opening to allow air and/or excess thermal compound 715 to escape the thermal gap 716 during the process of forming the semiconductor module (2304a). The thermal compound 715 is deposited on the die and/or the lid such that when the lid covers the die (at process 2308) the thermal compound is disposed within the thermal gap (2306). The lid 713 is placed over the die 10 so that the extensions 719 penetrate the barrier 714 in order to form the thermal gap 716 (2308). An outer rim 717 of the lid 713 can be sealed to the substrate 12 by sealant 718 (2310). The flexible barrier 714 is configured to prevent the thermal compound 715 from flowing outside the thermal gap 716. The curable materials (e.g., barrier 714 and sealant 718) should be cured (2314) (e.g., in an approximately 125-150 degree Celcius range for approximately 1-2 hours). Curing the barrier 714 simultaneously sets the flexible barrier 714 and adheres the flexible barrier 714 the substrate 12. Lastly, vents in the lid 713 that allow air to escape during the encapping process should be plugged (e.g., vent 730 plugged with plug 731) (2316). For example, to form the plug 731 an elastomer mechanical pin made of a fluorocarbon material may be inserted into the vent 730 followed by applying non-thermal sealant such as a UV adhesive.

Figure 8:
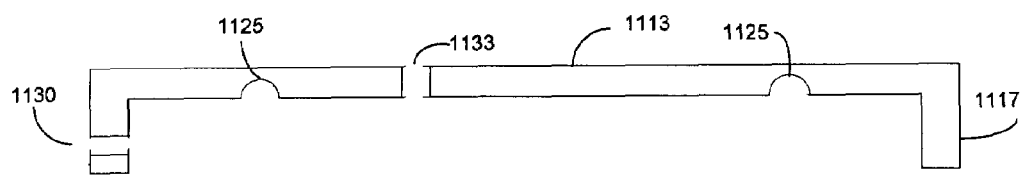
FIG. 8 is a schematic illustration of a partially completed semiconductor module of the present invention.
Figure 12:
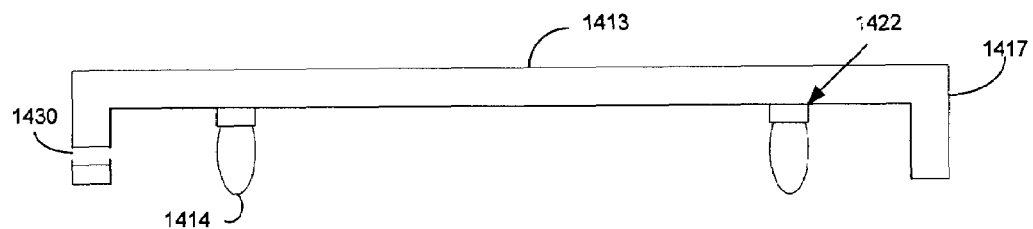
FIG. 12 is a schematic illustration of a partially completed semiconductor module of the present invention.
Figure 15:
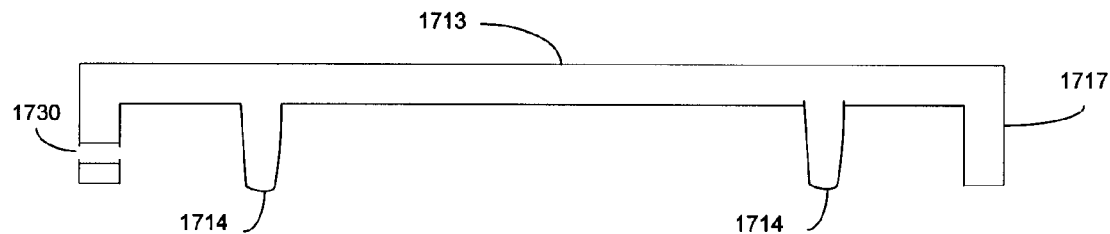
FIG. 15 is a schematic illustration of a partially completed semiconductor module of the present invention.
Figure 16:
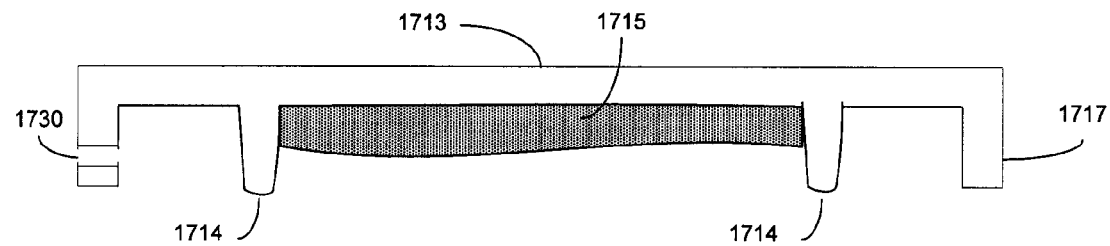
FIG. 16 is a schematic illustration of a partially completed semiconductor module of the present invention.
Figure 20:
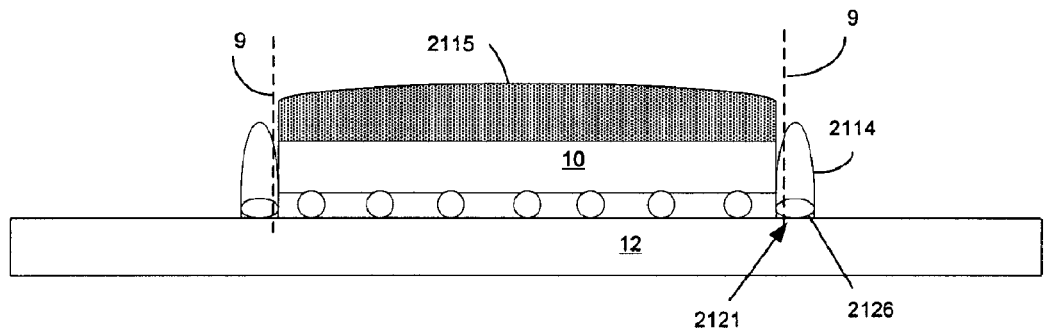
FIG. 20 is a schematic illustration of a partially completed semiconductor module of the present invention.
Figure 24:
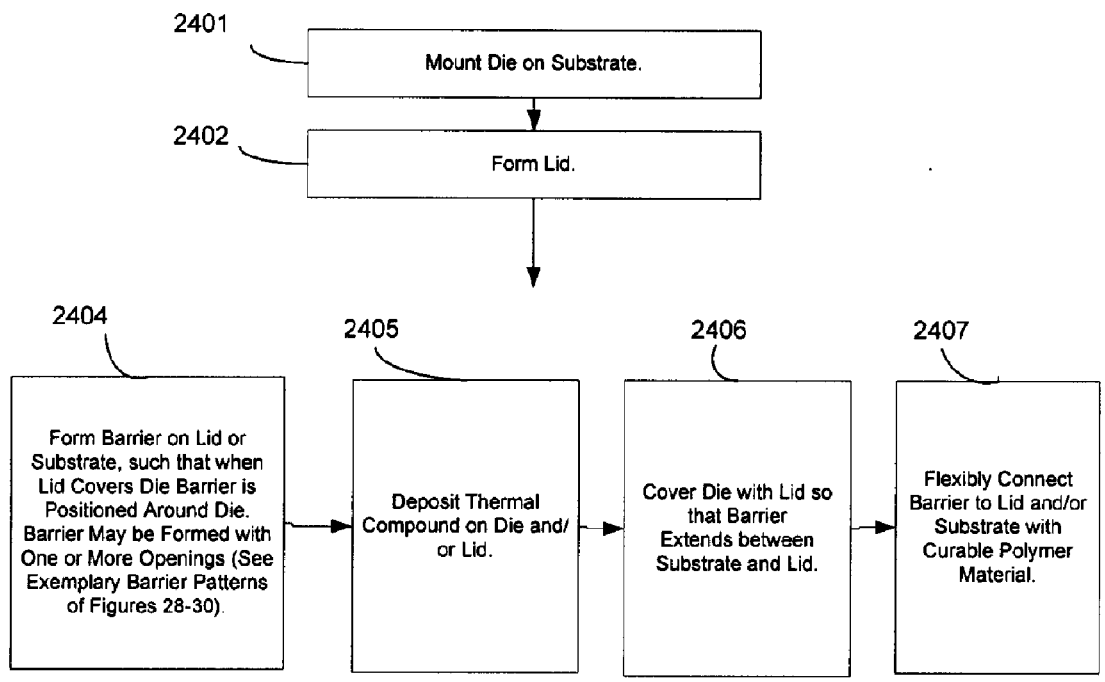
FIG. 24 is a schematic flow diagram illustrating another embodiment of the method of the invention.
Figure 24:
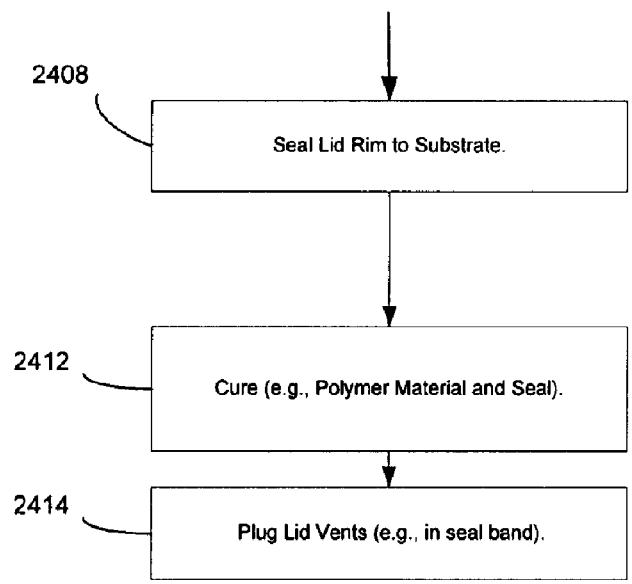

Referring to the flow diagram of FIG. 24 and structures 1100, 1400, 1700, and 2100 of FIGS. 11, 14, 17, and 21, respectively, the die 10 is mounted on the substrate 12 (2401, see FIG. 1 ) and the lid 1113 (see FIG. 8), 1413 (see FIG. 12), 1713 (see FIG. 15), 2113 (see FIG. 18) is formed (2402). The lid 1113, 1413, 1713, 2113 is formed such that it will cover the die 10 and extend beyond the periphery 9 of the die 10. The lid 1113, 1413, 1713, 2113 can also be formed with an outer rim 1117, 1417, 1717, 2117 that projects toward the substrate 12 and is sealed thereto by a sealant 1118, 1418, 1718, 2118 (at process 2408). A barrier is formed on the lid or the substrate such that when the lid covers the die the barrier is positioned adjacent the periphery of the die and will extend vertically between the substrate and the lid (2404). As the barrier is formed (2404), it can be patterned (see discussion regarding FIGS. 28-30 below) with at least one opening to allow air and/or excess thermal compound to escape the thermal gap during the process of forming the semiconductor module. The barrier can be formed of a rigid material (e.g., metal or plastic) that is either integrally formed with or attached to the substrate or the lid. The barrier is configured to prevent a thermal compound from flowing outside of the thermal gap created when the lid covers the die (at process 2406). The body of the barrier can be flexibly connected to the lid and/or the substrate (2407). The flexible connection is adapted to allow the thermal gap to flex in response to expansion and contraction of the substrate and the lid. A thermal compound is disposed within the thermal gap (2405). As discussed above with regard to other embodiments of the method, the thermal compound is deposited onto the die (see FIGS. 13 and 20) and/or onto the lid (see FIG. 16) such that when the lid covers the die at process 2406 the thermal compound is disposed within the thermal gap. As the lid covers the die at process 2406, a rim of the lid can be sealed to the substrate (2408). The curable materials (i.e., curable polymers) 1126, 1426, 1726, 2126 used to flexibly connect the body of the barrier to the lid and/or the substrate, as well as the sealant, should be cured (2412) (e.g., in an approximately 125-150 degree Celcius range for approximately 1-2 hours). Lastly, vents in the lid should be plugged (e.g., vents 1130, 1133 plugged with plugs 1131, 1134 (see FIG. 11); vent 1430 plugged with plug 1431 (see FIG. 14); vent 1730 plugged with plug 1731 (see FIG. 17); and vent 2130 plugged with plug 2131 (see FIG. 21)) (2414). For example, as mentioned previously vent plugs may be formed by inserting an elastomer mechanical pin made of a fluorocarbon material into a vent, followed by applying a non-thermal sealant such as a UV.

Figure 9:
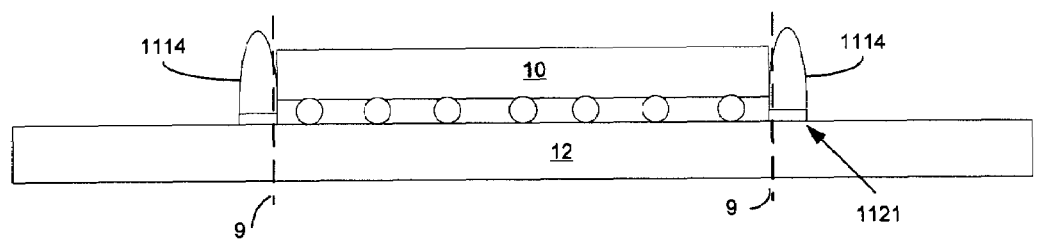
FIG. 9 is a schematic illustration of a partially completed semiconductor module of the present invention.
Figure 10:
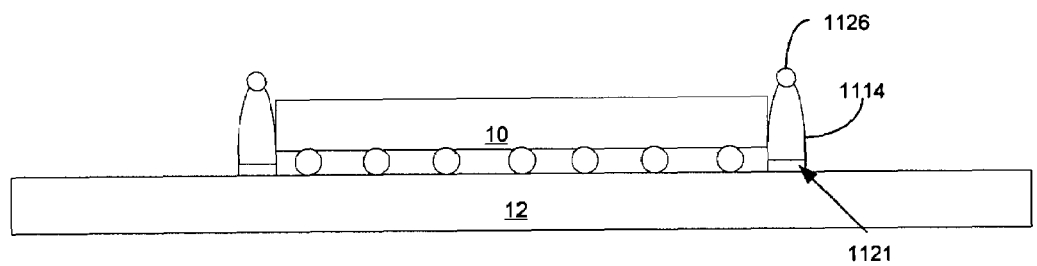
FIG. 10 is a schematic illustration of a partially completed semiconductor module of the present invention.
Figure 11:
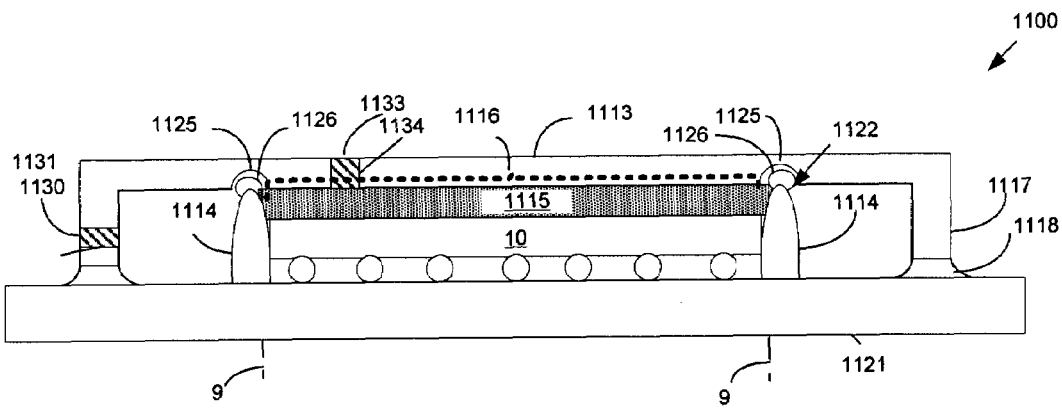
FIG. 11 is a schematic illustration of a partially completed semiconductor module of the present invention.

Referring to the flow diagrams of FIGS. 25-28, processes 2402-2407 are described in greater detail depending upon the structural embodiment. For example, referring to FIG. 25 and the structure 1100 of FIG. 11, a flexible connection is formed between the body of the barrier 1114 and the lid 1113 (i.e., second connection 1122). The barrier 1114 is formed by forming a metal or plastic barrier on the substrate 12 (2504, see FIG. 9). The first connection 1121 between the metal or plastic barrier 1114 and the substrate 12 may or may not be flexible. The lid 1113 is formed with a groove 1125, adapted for receiving a top of the barrier 1114 (2502, see FIG. 8). The body of the barrier 1114 is flexibly connected to the lid by a curable material (i.e., a curable polymer) 1126 (e.g., a thermosetting elastomer or a thermosetting b-stage epoxy resin) deposited on the top of the barrier 1114 (see FIG. 10) and/or into the groove 1125 (2506, see FIG. 11). When the lid 1113 covers the die 10, the top of the barrier 1114 is received by the groove 1125 (2505, see FIG. 11) and the curable material 1126 flexibly adheres the barrier 1114 to the groove 1125.

Figure 17:
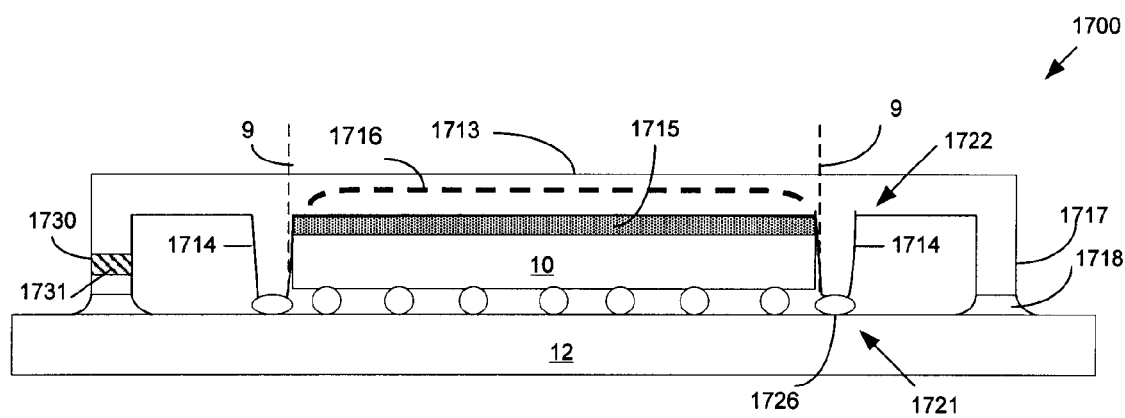
FIG. 17 is a schematic illustration of a completed semiconductor module of the present invention.
Figure 21:
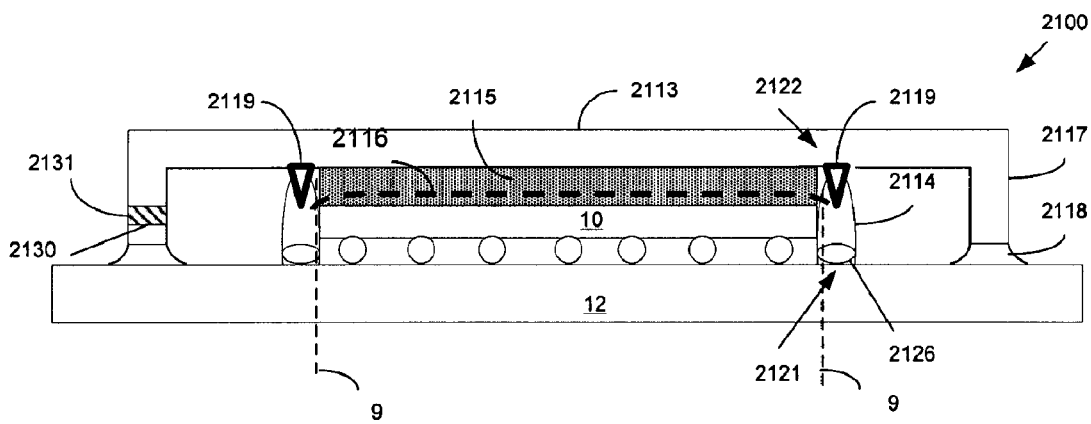
FIG. 21 is a schematic illustration of a completed semiconductor module of the present invention.

Referring to the structures 1400, 1700 and 2100 of FIGS. 14, 17 and 21, respectively, the flexible connection may be formed between the body of the barrier 1414, 1714, 2114 and the substrate 12 (i.e., first connection 1421, 1721, 2121 ). The second connection 1422, 1722, 2122 between the body of the barrier 1414, 1714, 2114 and the lid 1413, 1713, 2113 may or may not be flexible. For example, referring to FIG. 7, the barrier 1717 may be integrally formed with the lid 1713 such as a metal barrier machined into a metal lid. Alternatively, referring to FIG. 21, the barrier 2114 may be connected to the lid 2113 by a plurality of extensions 2119.

Figure 13:
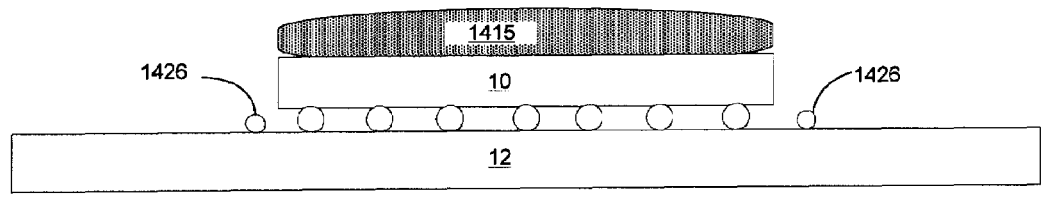
FIG. 13 is a schematic illustration of a partially completed semiconductor module of the present invention.
Figure 26:
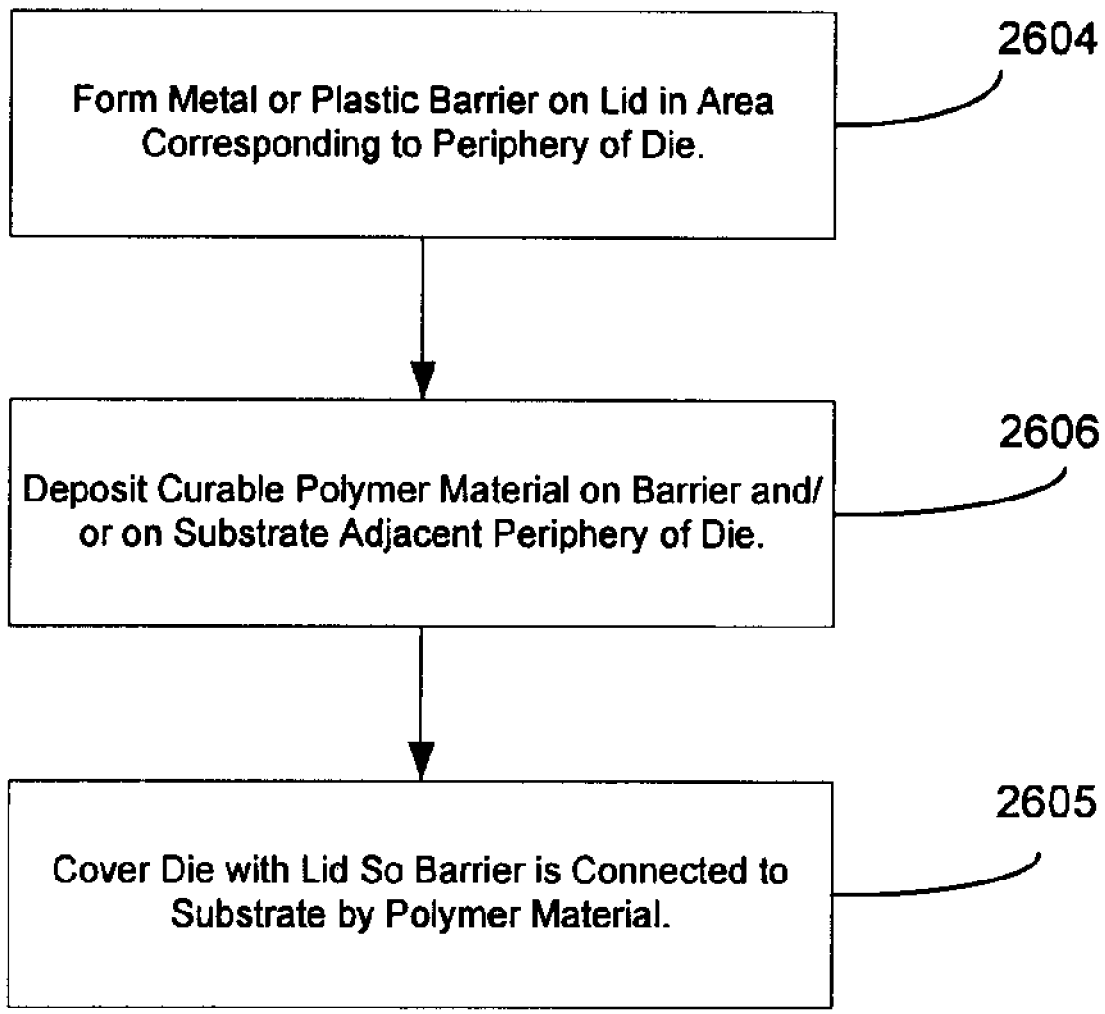

Referring particularly to the flow diagram of FIG. 26 and to structures 1400 and 1700 of FIGS. 14 and 17, respectively, a rigid barrier 1414, 1714 (e.g., metal or plastic) is formed on the lid 1413, 1713 (2604) The body of the barrier 1414, 1714 is flexibly connected to the substrate 12 by depositing a curable material (i.e., a curable polymer) 1426, 1726 (e.g., a thermosetting elastomer or a thermosetting b-stage epoxy resin) onto the barrier 1414, 1714 and/or onto the substrate adjacent the periphery 9 of the die 10 (2606, see FIG. 13). The die 10 is then covered with the lid 1413, 1713 so that the barrier 1414, 1714 is connected to the substrate 12 by the curable material 1426, 1726 (2605, see FIGS. 14 and 17).

Figure 18:
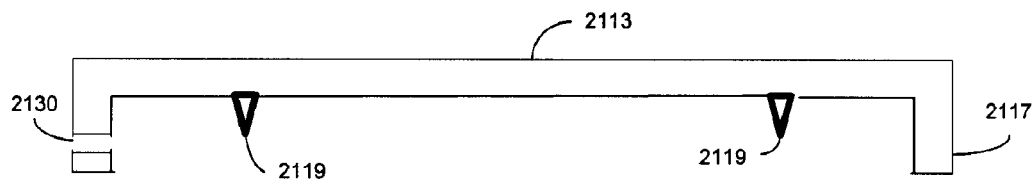
FIG. 18 is a schematic illustration of a partially completed semiconductor module of the present invention.
Figure 19:
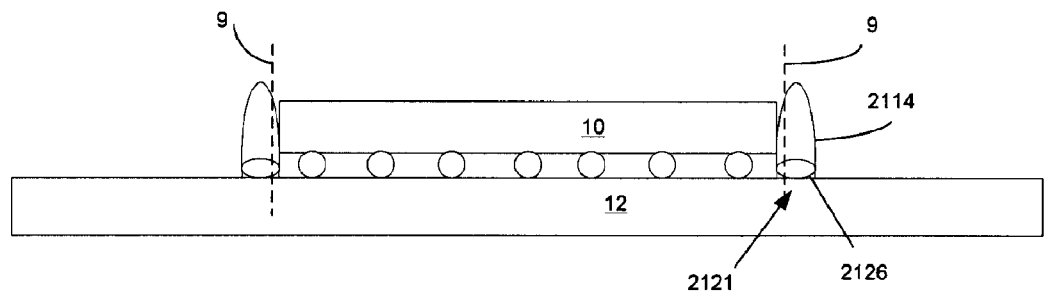
FIG. 19 is a schematic illustration of a partially completed semiconductor module of the present invention.
Figure 27:
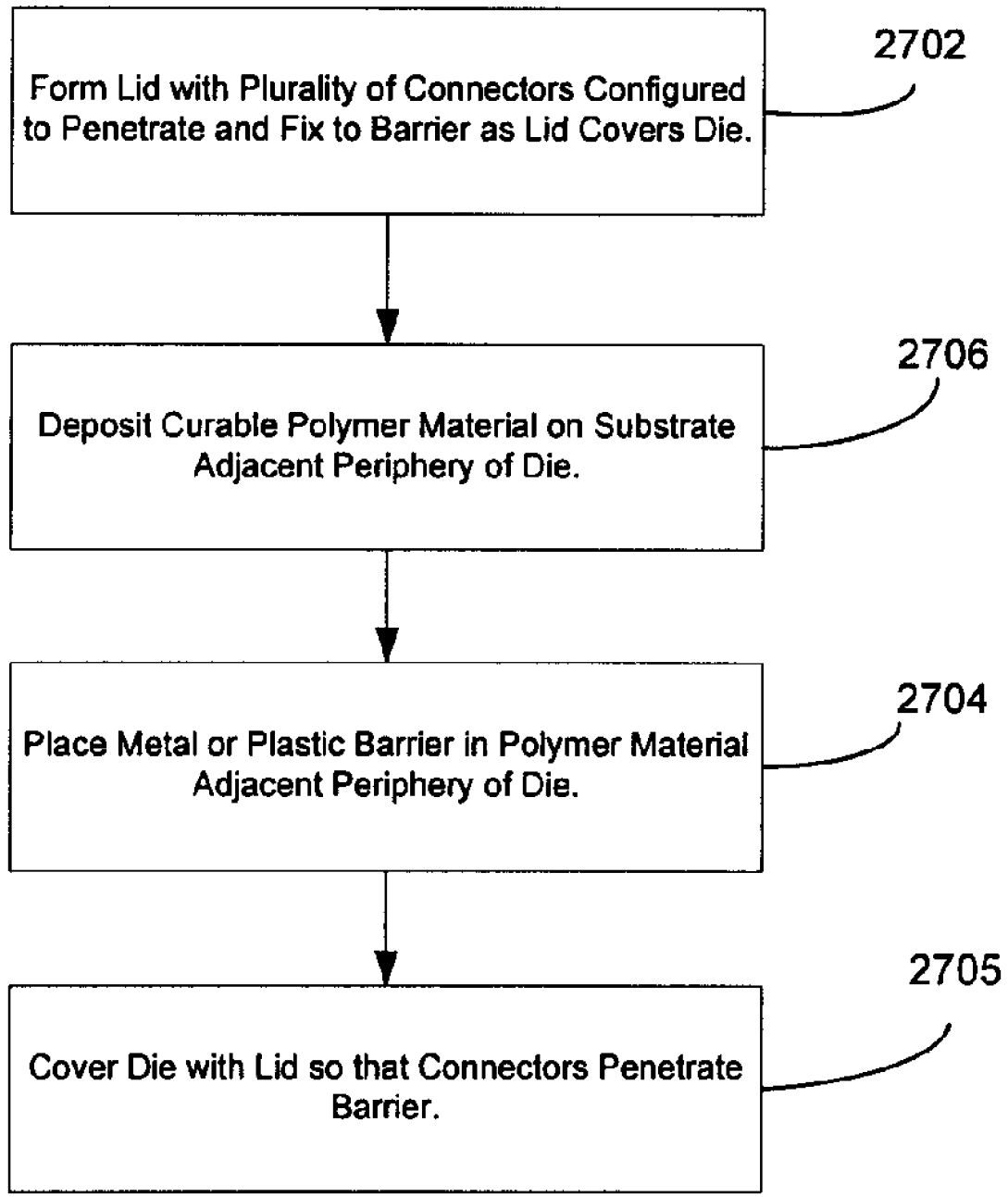

Referring particularly to the flow diagram of FIG. 27 and to the structure 2100 of FIG. 21, in this embodiment a lid 2113 is formed with a plurality of extensions 2119 (2702, see FIG. 18). The extensions 2119 can project from the bottom surface of the lid 2113 such that when the lid 2113 is placed over the die 10, the extensions 719 project towards the substrate and are aligned over the barrier 2114. The extensions 2119 provide a barrier contact area for connecting the lid 2113 to the barrier 2114 in order to form a complete barrier structure. The extensions 2119 can be configured to penetrate the barrier 2114 and to remain fixed thereto as the lid 2113 covers the die 10. The extensions 2119 can comprise blades with various features. Then, a curable material 2126 (e.g., a thermosetting elastomer or a thermosetting b-stage epoxy resin) is deposited to on the substrate 12 adjacent the periphery 9 of the die 10 (2706) and the rigid barrier 2114 is placed in the curable material 1126 (2704, see FIG. 19). As the lid 2113 covers the die 10 (2705), the extensions 2119 penetrate and remain fixed to the barrier 2114.

Figure 28:
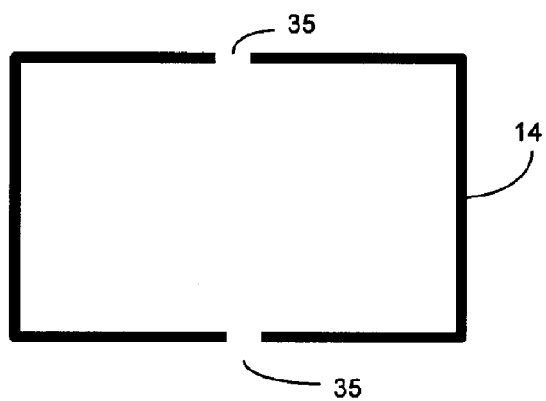
FIGS. 28-30 are schematic illustrations of exemplary barrier patterns referred to in method processes 2204, 2304 and 2404 of the embodiments of the method illustrated in FIGS. 22-24, respectively.
Figure 29:
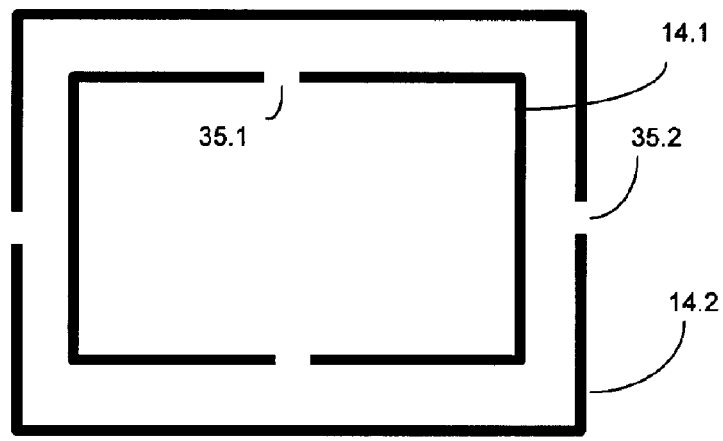
Figure 30:
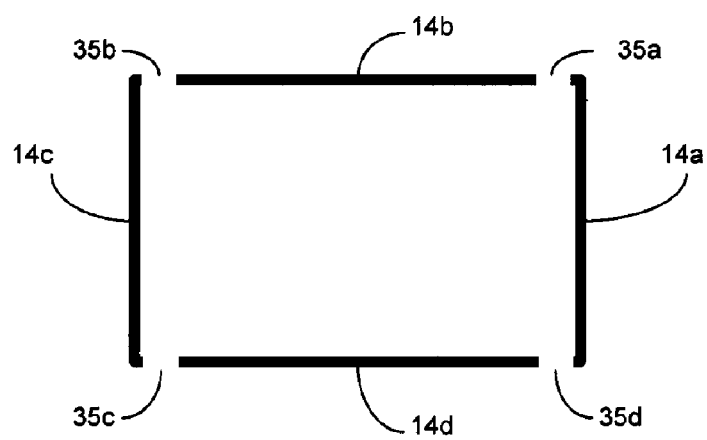

As mentioned above, FIGS. 28-30 illustrate exemplary barrier 14 patterns. These barrier 14 patterns are only exemplary and should not be viewed as limiting. These patterns may be used in method embodiments in which the barrier 14 is formed either on the substrate or on the lid. FIG. 28 illustrates a barrier 14 pattern with two opposing openings 35 which will allow air and small amounts of excess thermal compound to escape the thermal gap as it is being filled. FIG. 29 illustrates another barrier pattern in which a second barrier 14.2 surrounds a first barrier 14.1. Each barrier 14.1, 14.2 is configured with opposing openings 35.1 and 35.2 that are offset by 45 degrees to create a long path for the thermal compound to travel during the process of forming the semiconductor module. FIG. 30 illustrates a barrier 14 comprised of four walls 14a-d with openings 35a-d in each corner. Note that if the four-wall 14a-b pattern of FIG. 30 is used, the barrier 14 may be formed on the lid, the substrate or divided and formed on both the lid and the substrate.

Thus, the present invention discloses a semiconductor module and a method of forming the semiconductor module. The semiconductor module is configured to contain a thermal compound within a thermal gap between a die and a lid in order to ensure effective heat removal. The semiconductor module comprises a die mounted on a substrate and encapsulated by a lid. The semiconductor module further incorporates a barrier formed around the die between the substrate and a lid. The thermal compound is enclosed within the barrier. The barrier is particularly configured to flex in response to expansion and contraction of both the substrate and the lid during cycling of the semiconductor module, and thus, to accommodate for thermal compound pumping. The barrier comprises either a fully flexible material or a flexible connection to the substrate and/or to the lid. The disclosed semiconductor module effectively contains the thermal compound within the barrier between the die and the lid and, thereby, provides acceptable and controlled coverage of the thermal compound over the die for heat removal. While the invention has been described in terms of embodiments, those skilled in the art will recognize that the invention can be practiced with modification within the spirit and scope of the appended claims.

What is claimed is:

1. A semiconductor module comprising:
   a substrate;
   a die, having a periphery, on said substrate;
   a thermal compound covering said die;
   a barrier adjacent said periphery of said die;
   a planar lid on said thermal compound and extending horizontally beyond said barrier,
   wherein said barrier is adapted to contain said thermal compound and to flex in response to expansion and contraction of said substrate and said lid and wherein said barrier comprises a flexible cured polymer material that adheres directly to said substrate and said lid.

2. A semiconductor module comprising:
   a substrate;
   a die, having a periphery, on said substrate;
   a thermal compound covering said die;
   a barrier adjacent said periphery of said die;
   a planar lid on said thermal compound and extending horizontally beyond said barrier,
   wherein said barrier is adapted to contain said thermal compound and to flex in response to expansion and contraction of said substrate and said lid,
   wherein said barrier comprises a rigid material and at least one of a flexible first connection between said substrate and said barrier and a flexible second connection between said barrier and said lid,
   wherein said lid comprises a bottom surface positioned adjacent said thermal compound and a groove in said bottom surface;
   wherein said groove is adapted for receiving said barrier, and
   wherein said second flexible connection comprises a flexible cured polymer material adhering said barrier within said groove.

3. A semiconductor module comprising:
   a substrate;
   a die, having a periphery, on said substrate;
   a thermal compound covering said die;
   a barrier adjacent said periphery of said die;
   a planar lid on said thermal compound and extending horizontally beyond said barrier,
   wherein said barrier is adapted to contain said thermal compound and to flex in response to expansion and contraction of said substrate and said lid,
   wherein said barrier comprises a rigid material and at least one of a flexible first connection between said substrate and said barrier and a flexible second connection between said barrier and said lid,
   wherein said barrier comprises a metal baffier machined into said lid, and
   wherein said first flexible connection comprises a flexible cured polymer material adhering said barrier to said substrate.

4. A semiconductor module comprising:
   a substrate;
   a die, having a periphery, on said substrate;
   a thermal compound covering said die;
   a barrier adjacent said periphery of said die;
   a planar lid on said thermal compound and extending horizontally beyond said barrier, wherein said barrier is adapted to contain said thermal compound and to flex in response to expansion and contraction of said substrate and said lid, wherein said lid comprises a plurality of extensions that project away from said lid towards said substrate and that are aligned above said barrier, and wherein said plurality of extensions are adapted to penetrate and remain fixed to said barrier when said lid covers said die.

5. The module of claim 4, wherein said barrier comprises a flexible cured polymer material adhered directly to said substrate.

6. The module of claim 4, wherein said barrier comprises a rigid material, and wherein said a flexible cured polymer material adheres said barrier to said substrate.

* * * * *